United States Patent
Isaacs

(10) Patent No.: US 9,839,128 B2
(45) Date of Patent: Dec. 5, 2017

(54) SOLDER VOID REDUCTION BETWEEN ELECTRONIC PACKAGES AND PRINTED CIRCUIT BOARDS

(71) Applicant: International Business Machines Corporation, Armonk, NY (US)

(72) Inventor: Phillip D. Isaacs, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/220,771

(22) Filed: Jul. 27, 2016

(65) Prior Publication Data
US 2016/0338200 A1   Nov. 17, 2016

Related U.S. Application Data

(62) Division of application No. 14/044,135, filed on Oct. 2, 2013, now Pat. No. 9,462,703.

(51) Int. Cl.
*H05K 7/10* (2006.01)
*H05K 7/12* (2006.01)
(Continued)

(52) U.S. Cl.
CPC ......... *H05K 1/181* (2013.01); *H05K 1/0206* (2013.01); *H05K 1/0207* (2013.01); *H05K 1/0215* (2013.01); *H05K 1/114* (2013.01); *H05K 1/116* (2013.01); *H05K 3/3431* (2013.01); *H05K 3/429* (2013.01); *H05K 1/0209* (2013.01); *H05K 3/3436* (2013.01); *H05K 2201/09572* (2013.01); *H05K 2201/10727* (2013.01); *H05K 2201/10969* (2013.01); *H05K 2203/0207* (2013.01); *H05K 2203/176* (2013.01); *Y10T 29/49144* (2015.01)

(58) Field of Classification Search
USPC .......................................... 361/767; 257/773
See application file for complete search history.

(56) References Cited

U.S. PATENT DOCUMENTS 7,291,790 B2   11/2007   Bachar et al.
8,158,892 B2   4/2012   Goergen et al.
(Continued)

OTHER PUBLICATIONS

"Details of the Assembly and Solder Pad Design of the OSLON, OSLON SSL and OSLON Square Family", OSRAM Opto semiconductors, Dec. 2011, 9 pages.

*Primary Examiner* — Andargie M Aychillhum
(74) *Attorney, Agent, or Firm* — DeLizio Law, PLLC

(57) ABSTRACT

An apparatus includes a printed circuit board. The printed circuit board includes at least one conductive layer on top a first dielectric layer, wherein the at least one conductive layer comprises at least one of a ground plane and a power plane. The printed circuit board includes a second dielectric layer on top of the at least one conductive layer. The printed circuit board includes a thermal pad on top of the second dielectric layer. The printed circuit board is fabricated by forming at least one plated through hole for electrically coupling the thermal pad to the at least one conductive layer. The printed circuit board is fabricated by backdrilling the at least one plated through hole to remove a portion of the conductive material, wherein subsequent to the backdrilling the conductive material remaining in the at least one plated through hole electrically couples one or more of the at least one conductive layer to the thermal pad.

8 Claims, 8 Drawing Sheets

(51) Int. Cl.
*H05K 1/18* (2006.01)
*H05K 3/42* (2006.01)
*H05K 1/02* (2006.01)
*H05K 1/11* (2006.01)
*H05K 3/34* (2006.01)

(56) References Cited

U.S. PATENT DOCUMENTS

| | | | |
|---|---|---|---|
| 2004/0256731 A1* | 12/2004 | Mao | C08L 65/00 257/773 |
| 2009/0058425 A1 | 3/2009 | Bartley et al. | |
| 2009/0188710 A1 | 7/2009 | Senk | |
| 2009/0258538 A1 | 10/2009 | Yaghmai et al. | |
| 2013/0256850 A1* | 10/2013 | Danny | H01L 23/66 257/664 |
| 2015/0092374 A1 | 4/2015 | Isaacs | |

* cited by examiner

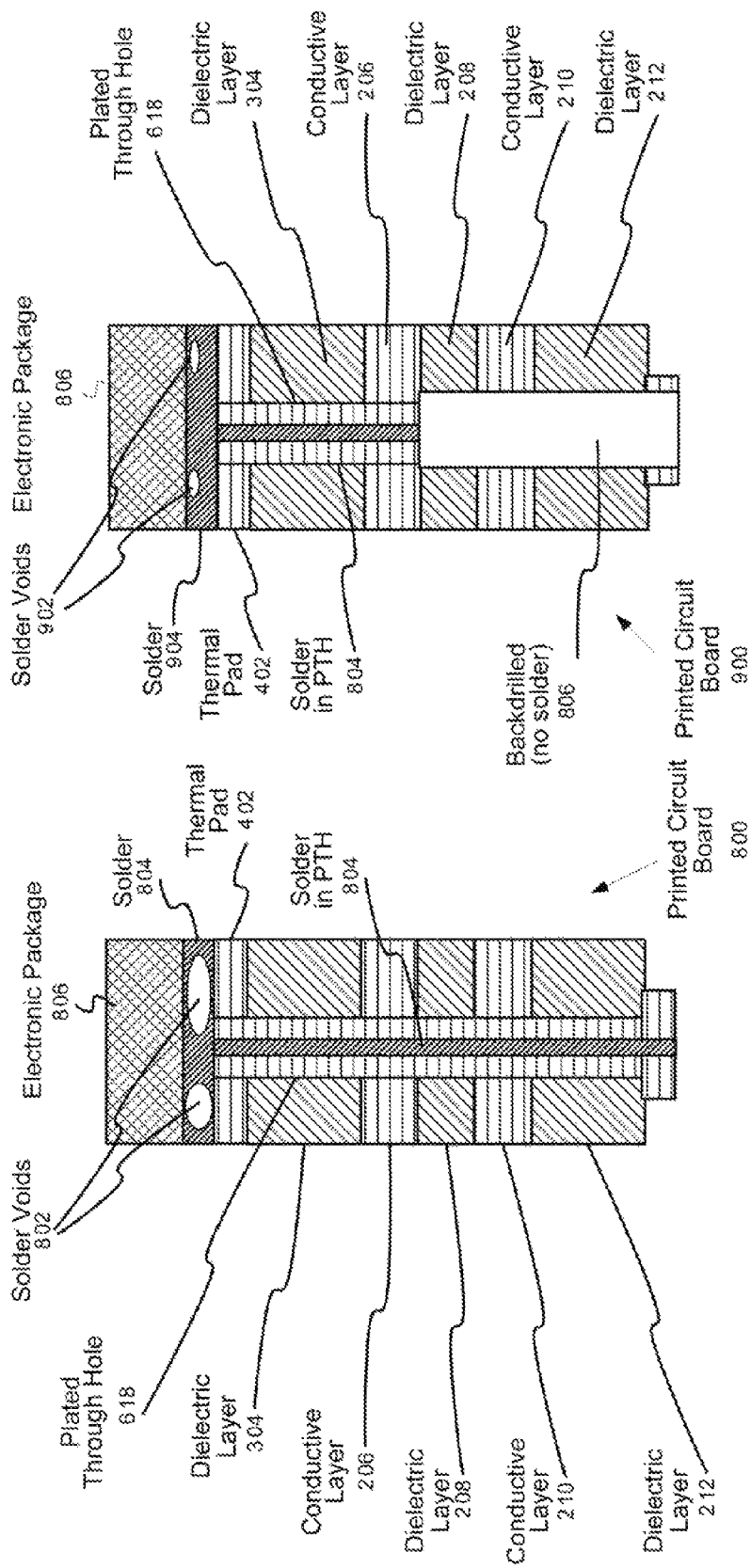

SOLDER VOID REDUCTION BETWEEN ELECTRONIC PACKAGES AND PRINTED CIRCUIT BOARDS

RELATED APPLICATIONS

This application is a Division of and claims the priority benefit of United States of America application Ser. No. 14/044,135 filed Oct. 2, 2013.

BACKGROUND

Embodiments of the inventive subject matter generally relate to the field of printed circuit board fabrication and, more particularly, to solder void reduction of solder between thermal pads on printed circuit boards and electronic packages attached thereto.

Printed Circuit Boards (PCB) are used to electrically connect different electrical components together. The electrical components can include different types of electronic packages (e.g., Quad Flat No-lead (QFN) packages), resistors, capacitors, etc. The PCBs are typically configured to include thermal or conductive pads (e.g., a copper pads). An electronic package can be physically and electrically connected to the PCB on top of a thermal pad using solder. In addition to providing electrical connectivity for the electronic package to the PCB, these thermal pads typically serve as a heatsink. Acting as a heatsink, the thermal pad can provide a thermal dissipation pathway from the electronic package to conductive layers in the PCB. Conventional approaches for PCBs include Plated Through Holes (PTHs) in the thermal pads that are used for both electrical connectivity and thermal dissipation. However, these PTHs can be problematic when the electronic packages are being soldered to the thermal pads. Specifically, during the soldering process, these PTHs can thieve solder from the solder joint, thereby leaving large solder voids between the electronic package and the thermal pad. Voids can also be formed in the solder because of the volatility of the flux solvents in which the PTHs allow for venting of the outgassing from the heated solvents.

SUMMARY

In some embodiments, a method includes fabricating a printed circuit board. The fabricating includes forming at least one conductive layer on top a first dielectric layer, wherein the at least one conductive layer comprises at least one of a ground plane and a power plane. The fabricating includes forming a second dielectric layer on top of the at least one conductive layer. The fabricating includes forming a thermal pad on top of the second dielectric layer, wherein an electronic package is to be soldered on top of the thermal pad. The fabricating includes forming at least one through hole through the thermal pad, the second dielectric layer, the at least one conductive layer, and the first dielectric layer. The fabricating includes filling the at least one through hole with a conductive material to form at least one plated through hole for electrically coupling the thermal pad to the at least one conductive layer. The fabricating includes backdrilling the at least one plated through hole to remove a portion of the conductive material, wherein subsequent to the backdrilling the conductive material remaining in the at least one plated through hole electrically couples one or more of the at least one conductive layer to the thermal pad.

In some embodiments, a method includes fabricating a printed circuit board. The fabricating includes forming at least one first conductive layer on top a first dielectric layer, wherein the at least one first conductive layer comprises at least one of a ground plane and a power plane. The fabricating includes forming a second dielectric layer on top of the at least one first conductive layer. The fabricating includes forming a second conductive layer on top of the second dielectric layer, wherein the second conductive layer comprises at least one of a ground plane and a power plane. The fabricating includes forming a third dielectric layer on top of the second conductive layer. The fabricating includes forming a thermal pad on top of the third dielectric layer, wherein an electronic package is to be soldered on top of the thermal pad. The fabricating includes forming at least one through hole in the thermal pad, the third dielectric layer, the second conductive layer, the second dielectric layer, the at least one first conductive layer, and the first dielectric layer. The fabricating includes filling the at least one through hole with a conductive material to form at least one plated through hole for electrically coupling the thermal pad to the at least one first conductive layer and the second conductive layer. The fabricating includes backdrilling the at least one plated through hole to remove a portion of the conductive material, wherein subsequent to the backdrilling the conductive material remaining in the at least one plated through hole electrically couples the second conductive layer to the thermal pad and wherein the conductive material remaining does not electrically couple the at least one first conductive layer to the thermal pad.

In some embodiments, an apparatus includes a printed circuit board. The printed circuit board includes a first dielectric layer. The printed circuit board includes at least one conductive layer formed on top of the first dielectric layer, wherein the at least one conductive layer comprises at least one of a ground plane and a power plane. The printed circuit board includes a second dielectric layer formed on top of the at least one conductive layer. The printed circuit board includes a thermal pad formed on top of the second dielectric layer, wherein an electrical package is to be soldered on top of the thermal pad. The printed circuit board includes at least one plated through hole filled with conductive material, wherein the at least one plated through hole extends through the thermal pad, the second dielectric layer, the at least one conductive layer, and the first dielectric layer, wherein a portion of the conductive material has been removed using a backdrill operation, wherein the conductive material that remains after the backdrill operation electrically couples one or more of the at least one conductive layer to the thermal pad.

BRIEF DESCRIPTION OF THE DRAWINGS

The present embodiments may be better understood, and numerous objects, features, and advantages made apparent to those skilled in the art by referencing the accompanying drawings.

FIG. 8 depicts a cutaway side view of a portion of a PCB having an electronic package soldered to a thermal pad without reduced solder voids.

FIG. 9 depicts a cutaway side view of a portion of a PCB having an electronic package soldered to a thermal pad with reduced solder voids, according to some embodiments.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, although examples refer to Printed Circuit Boards, various embodiments can used in the fabrication of other types of boards or cards used for attaching various electrical components for electrically coupling the electrical components. In other instances, well-known structures and techniques have not been shown in detail in order not to obfuscate the description.

Various embodiments include PCB fabrication that reduce solder voids for the solder between thermal pads of the PCB and electronic packages that are to be attached on top of the thermal pads. As described above, the PCBs include plated through holes (PTHs) that extend down through the thermal pads. The plated through holes can be used for both electrical connectivity and thermal dissipation using conductive layers within the PCB. In some embodiments, prior to soldering electronic packages on top of the thermals pads, one or more of the plated through holes are backdrilled (from the bottom of the PCB) partially to remove the conductive material (e.g., copper) therein. As a result, when the solder is applied to the thermal pads for attaching the electronic packages, the solder will only wet as far down in the plated through holes as the conductive material remaining in the plated through holes after the backdrilling.

Accordingly, various embodiments can cause less solder to be thieved by the plated through holes during the solder process in comparison to conventional approaches. Specifically, less conductive material in the plated through holes will thieve less solder. Because less solder is thieved by the plated through holes during the soldering process, various embodiments provide a better thermal interface formed by the solder joint between the electronic package and the PCB. As further described below, the plated through holes also provide electrical connectivity between the electronic package and one or more conductive layers formed below the thermal pad within the PCB. In some embodiments, one or more of the conductive layers can be a ground plane to serve as a grounding for the electronic package. In some embodiments, one or more of the other conductive layers can be a power plane to be a conduit for power to the electronic package. In some embodiments, these conductive layers are not used for transmitting signals during operation of the electronic package.

Figure 1:
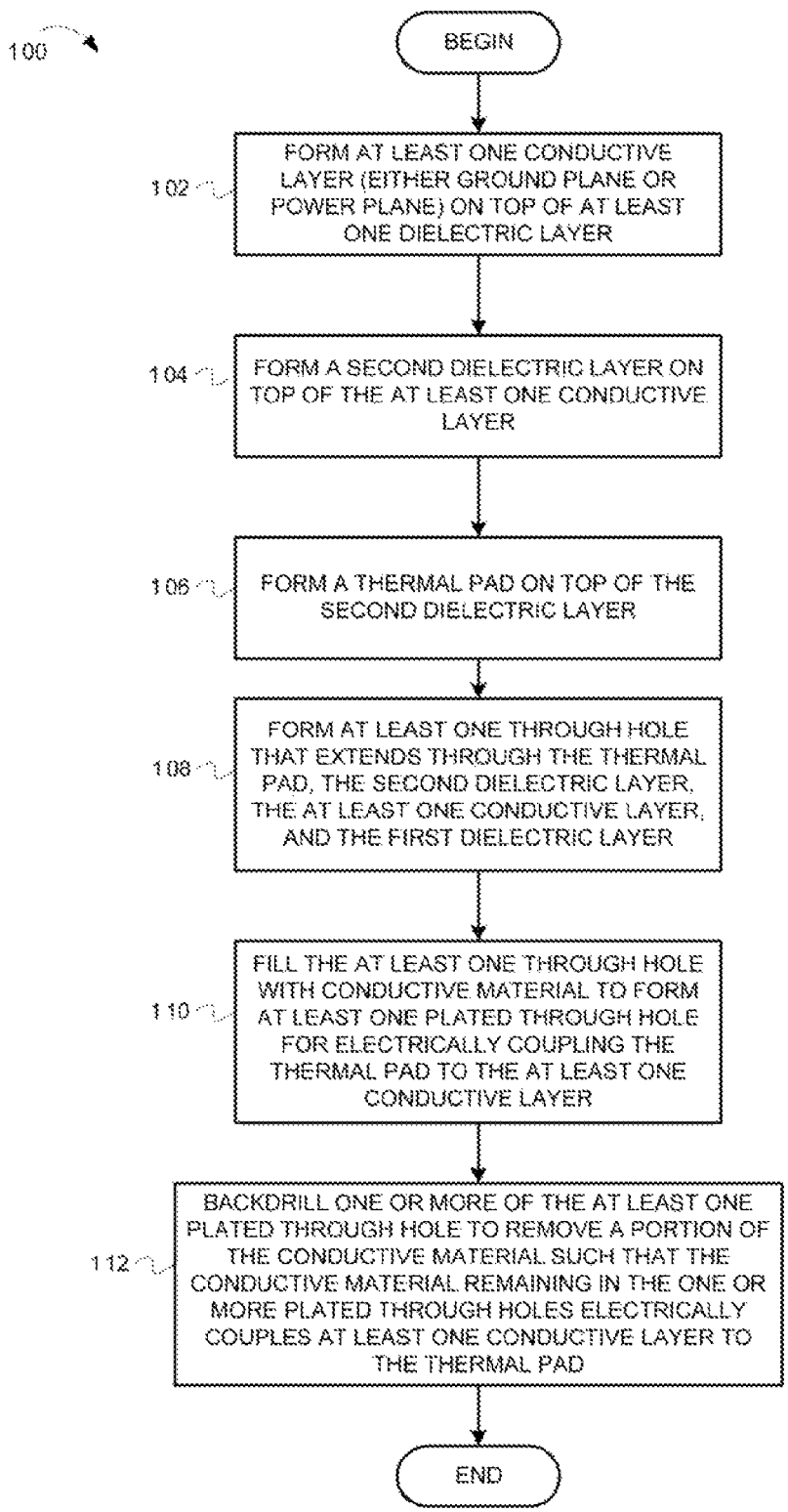
FIG. 1 depicts a flowchart of operations for PCB fabrication to provide reduced solder void reduction for the solder between an electronic package and a thermal pad of the PCB, according to some embodiments.

FIG. 1 depicts a flowchart of operations for PCB fabrication to provide reduced solder void for the solder between an electronic package and a thermal pad of the PCB, according to some embodiments. FIG. 1 is described in reference to FIGS. 2-9 which depict PCBs at various stages of PCB fabrication. FIGS. 1-9 depict fabrication of one thermal pad for attaching one electronic package. However, embodiments can include fabrication of multiple thermal pads for attaching multiple electronic packages. Operations of a flowchart 100 begin at block 102.

Figure 2:
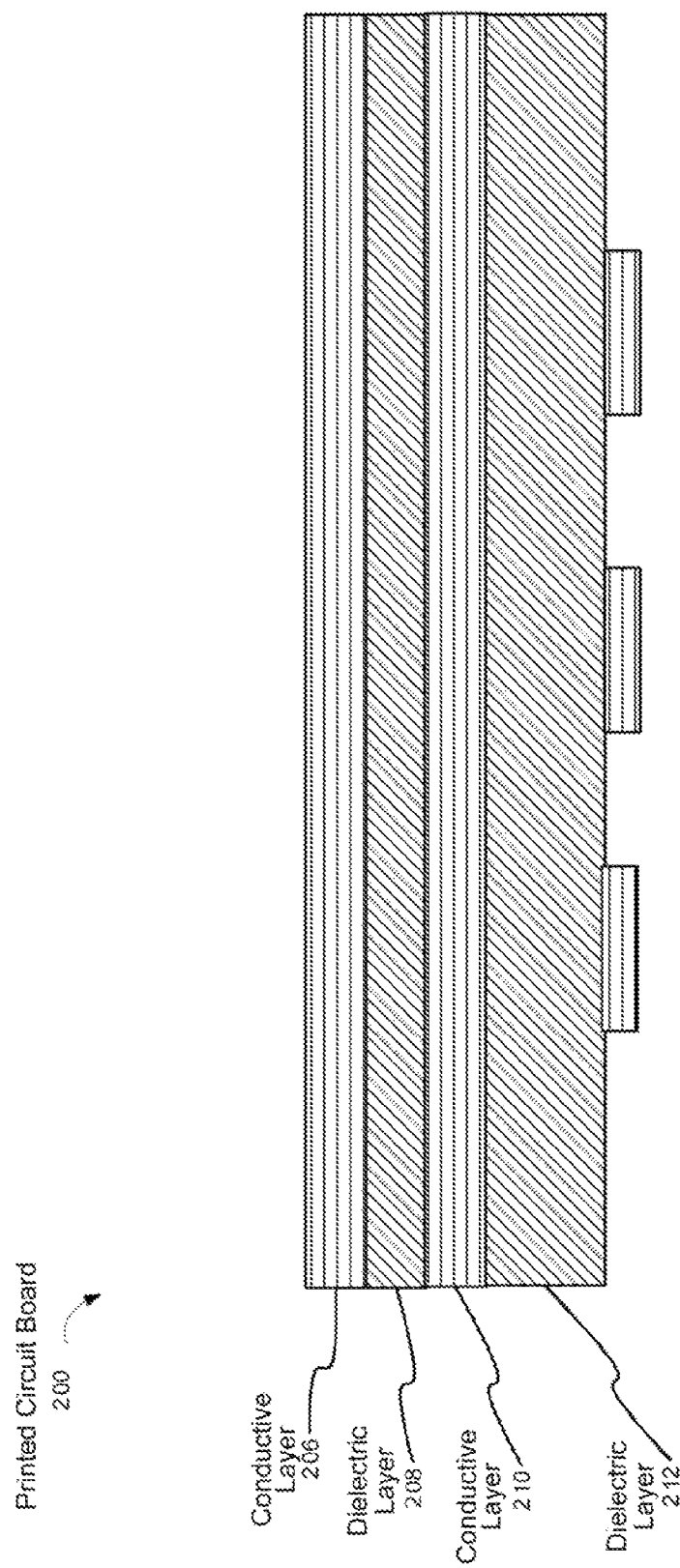
FIG. 2 depicts a cutaway side view of a PCB during a first stage of fabrication, according to some embodiments.

At block 102, at least one conductive layer is formed on top of at least one dielectric layer. To help illustrate, FIG. 2 depicts a cutaway side view of a PCB during a first stage of fabrication, according to some embodiments. In this example, the current stage of fabrication of a PCB 200 is such that two dielectric layers and two conductive layers have been formed. On the PCB 200, a conductive layer 210 is formed on top of a dielectric layer 212. A dielectric layer 208 is formed on top of the conductive layer 210. A conductive layer 206 is then formed on top of the dielectric layer 208. In some embodiments, the conductive layer 206 and the conductive layer 210 can serve multiple purposes the electrical components and electronic packages attached to the PCB 200 are operational. First, the conductive layer 206 and the conductive layer 210 can be part of the thermal dissipation of heat generated by the electronic packages attached to the PCB 200 (as further described below). Also, the conductive layer 206 and the conductive layer 210 can be at least one of a ground plane and a power plane. Specifically, the conductive layer 206 and the conductive layer 208 can serve as a grounding or providing power to the electronic packages attached to the PCB 200. For example, the conductive layer 206 can be a power plane, and the conductive layer 210 can be a ground plane. In another example, the conductive layer 206 and the conductive layer 210 can both be power planes or ground planes. In this example, the PCB 200 only includes two conductive layers. However, the PCB 200 can have any number of conductive layers interleaved with dielectric layers as shown. In some embodiments, the conductive layer 206 and the conductive layer 210 are not used for transmitting signals during operation of the electronic package. Operations of the flowchart 100 continue at block 104.

Figure 3:
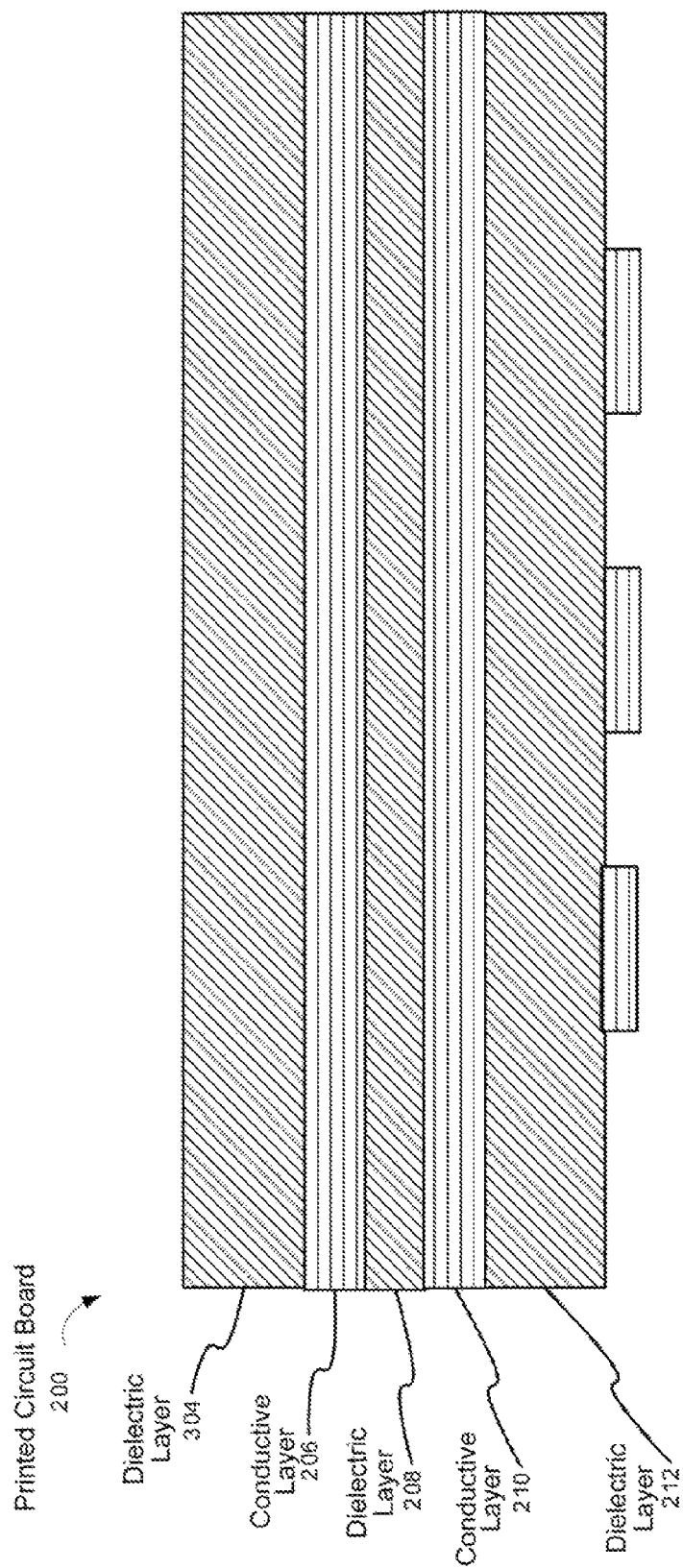
FIG. 3 depicts a cutaway side view of a PCB during a second stage of fabrication, according to some embodiments.

At block 104, a second dielectric layer is formed on top of the at least one conductive layer. To help illustrate, FIG. 3 depicts a cutaway side view of a PCB during a second stage of fabrication, according to some embodiments. In particular, FIG. 3 depicts the PCB 200 at a next stage of fabrication after the stage depicted in FIG. 2. On the PCB 200, a dielectric layer 304 is formed on top of the conductive layer 206. Operations of the flowchart 100 continue at block 106.

Figure 4:
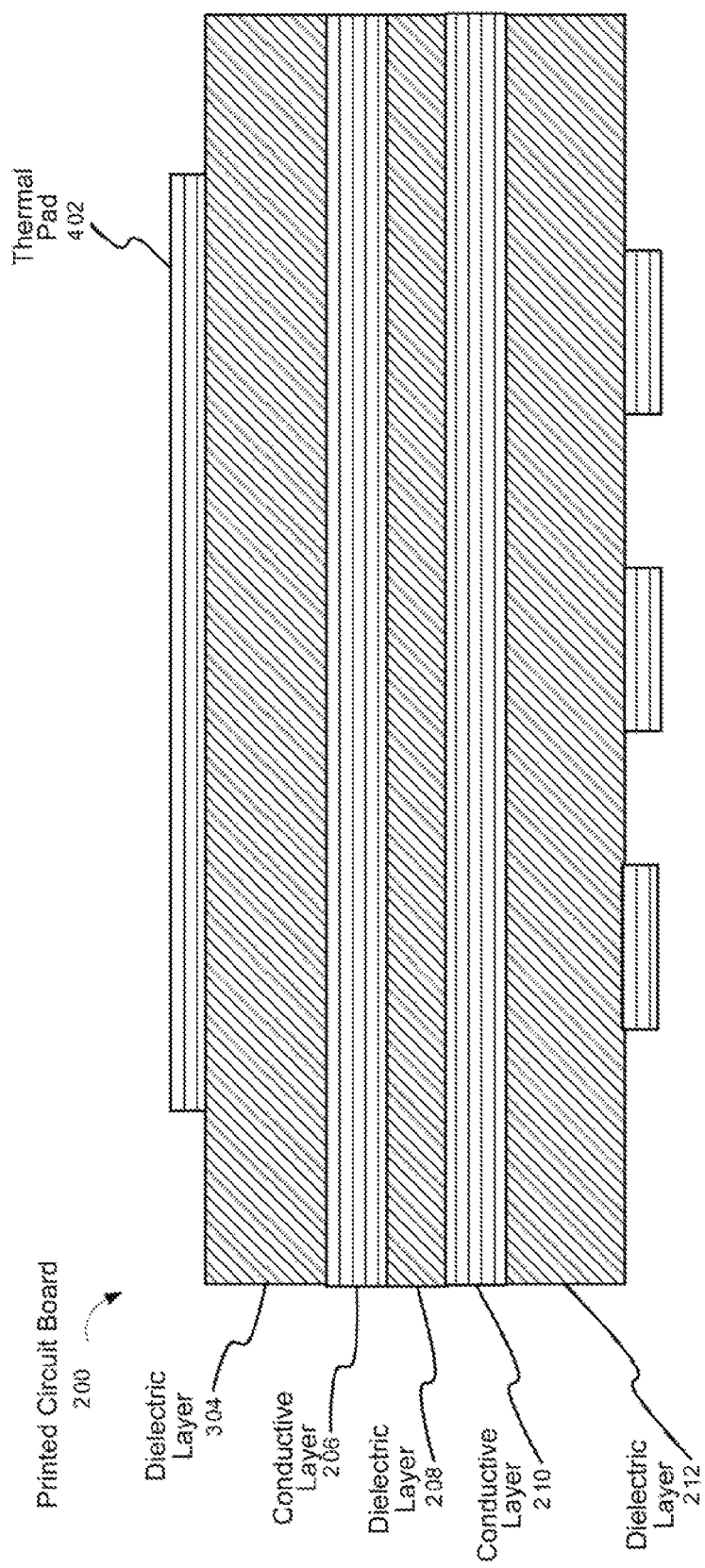
FIG. 4 depicts a cutaway side view of a PCB during a third stage of fabrication, according to some embodiments.

At block 106, a thermal pad is formed on top of the second dielectric layer. To help illustrate, FIG. 4 depicts a cutaway side view of a PCB during a third stage of fabrication, according to some embodiments. In particular, FIG. 4 depicts the PCB 200 at a next stage of fabrication after the stage depicted in FIG. 3. On the PCB 200, a thermal pad 402 is formed on top of the dielectric layer 304. As further described below, the thermal pad 402 can be a location on the PCB 200 where an electronic package can be soldered. In addition to providing electrically connectivity for the electronic package to the PCB 200, the thermal pad 402 can serve as a heatsink. Acting as a heatsink, the thermal pad 402 can provide a thermal dissipation pathway from the electronic package to the PCB 200. Operations of the flowchart 100 continue at block 108.

Figure 5:
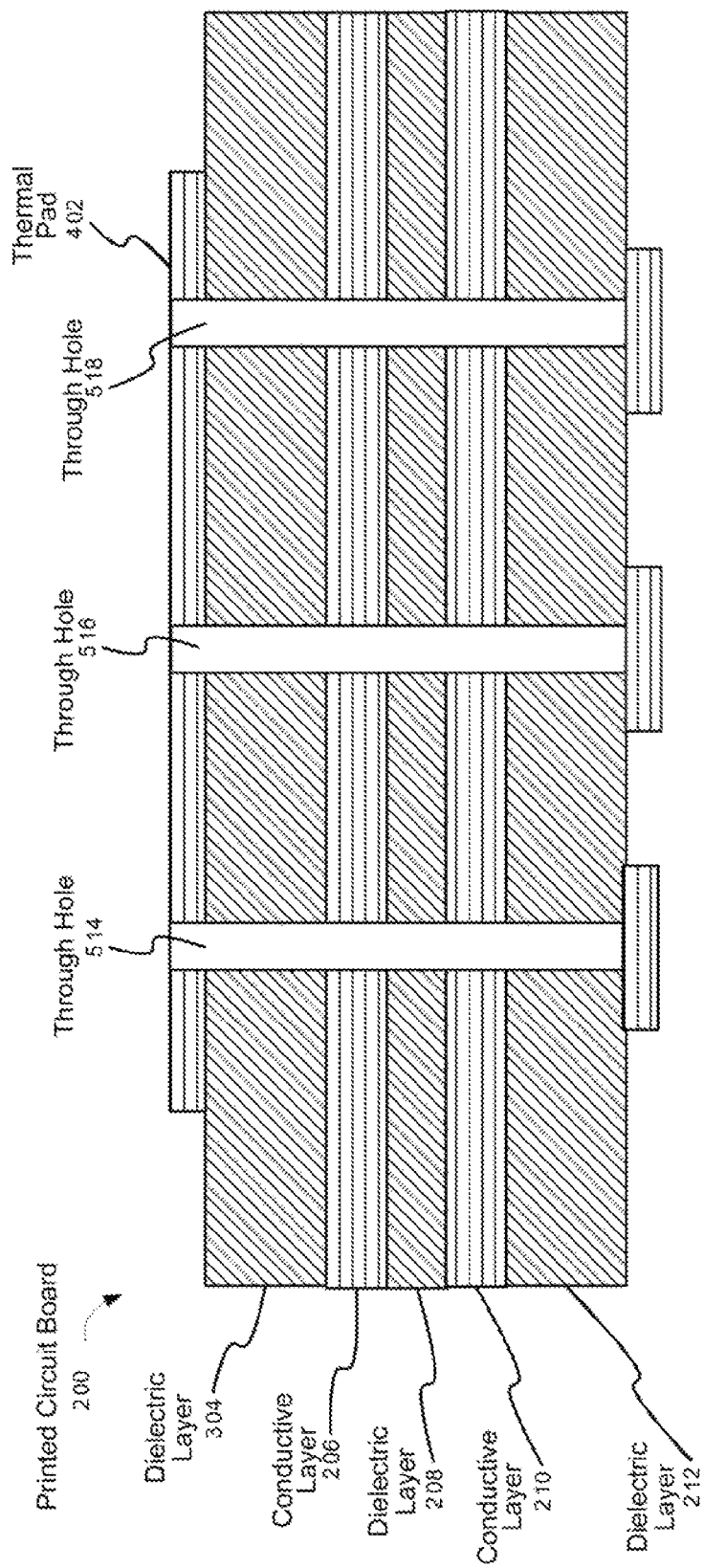
FIG. 5 depicts a cutaway side view of a PCB during a fourth stage of fabrication, according to some embodiments.

At block 108, at least one through hole is formed through the thermal pad and extends through the second dielectric layer, the at least one conductive layer, and the at least one dielectric layer. To help illustrate, FIG. 5 depicts a cutaway side view of a PCB during a fourth stage of fabrication, according to some embodiments. In particular, FIG. 5 depicts the PCB 200 at a next stage of fabrication after the stage depicted in FIG. 4. On the PCB 200, a through hole 514, a through hole 516, and a through hole 518 are formed through the thermal pad 402, the dielectric layer 304, the conductive layer 206, the dielectric layer 208, the conductive layer 210, and the dielectric layer 212. In this example, the PCB 200 includes three through holes. However, embodiments can include any number of through holes. Operations of the flowchart 100 continue at block 110.

Figure 6:
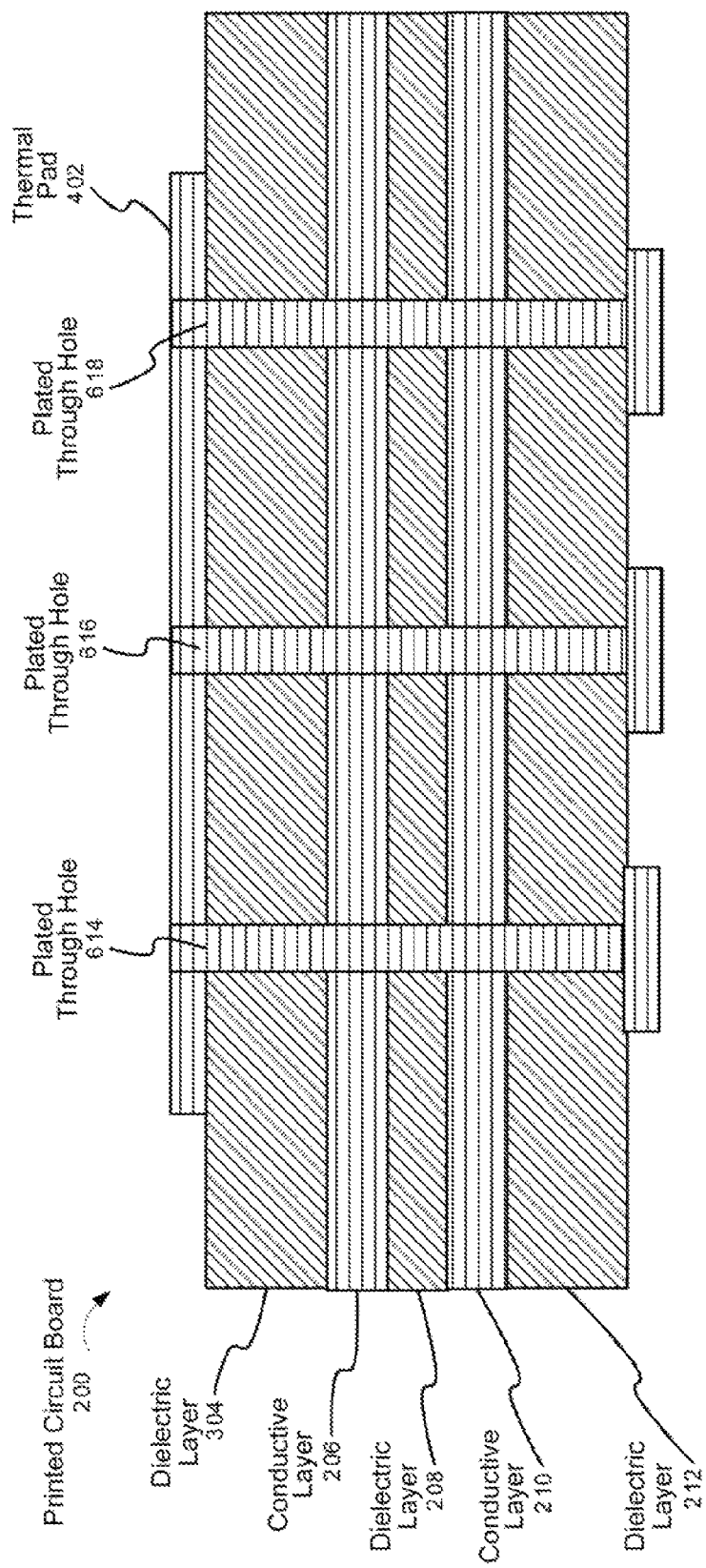
FIG. 6 depicts a cutaway side view of a PCB during a fifth stage of fabrication, according to some embodiments.

At block 110, the at least one through hole is filled with conductive material to form at least one plated through hole for electrically coupling the thermal pad to the at least one conductive layer. To help illustrate, FIG. 6 depicts a cutaway side view of a PCB during a fifth stage of fabrication, according to some embodiments. In particular, FIG. 6 depicts the PCB 200 at a next stage of fabrication after the stage depicted in FIG. 5. On the PCB 200, a plated through hole 614, a plated through hole 616, and a plated through hole 618 are formed after the through hole 514, the through hole 516, and the through hole 518, respectively, are filled with conductive material. In some embodiments, the conductive material can be copper. The plated through hole 614, the plated through hole 616, and the plated through hole 618 can be a conduit for both thermal dissipation and electrical connectivity. For example, the thermal pad 402 can act as a heatsink for heat generated by an electronic package that is to be soldered thereto. The plated through hole 614, the plated through hole 616, and the plated through hole 618 can provide thermal dissipation pathways from the thermal pad 402 to the conductive layer 206 and the conductive layer 210. Also, the conductive layer 206 and the conductive layer 210 can be at least one of a ground plane and a power plane. Therefore, the plated through hole 614, the plated through hole 616, and the plated through hole 618 can provide an electrical connectivity from the electronic package to the conductive layer 206 and the conductive layer 210 for at least one of a ground and power. Operations of the flowchart 100 continue at block 112.

Figure 7:
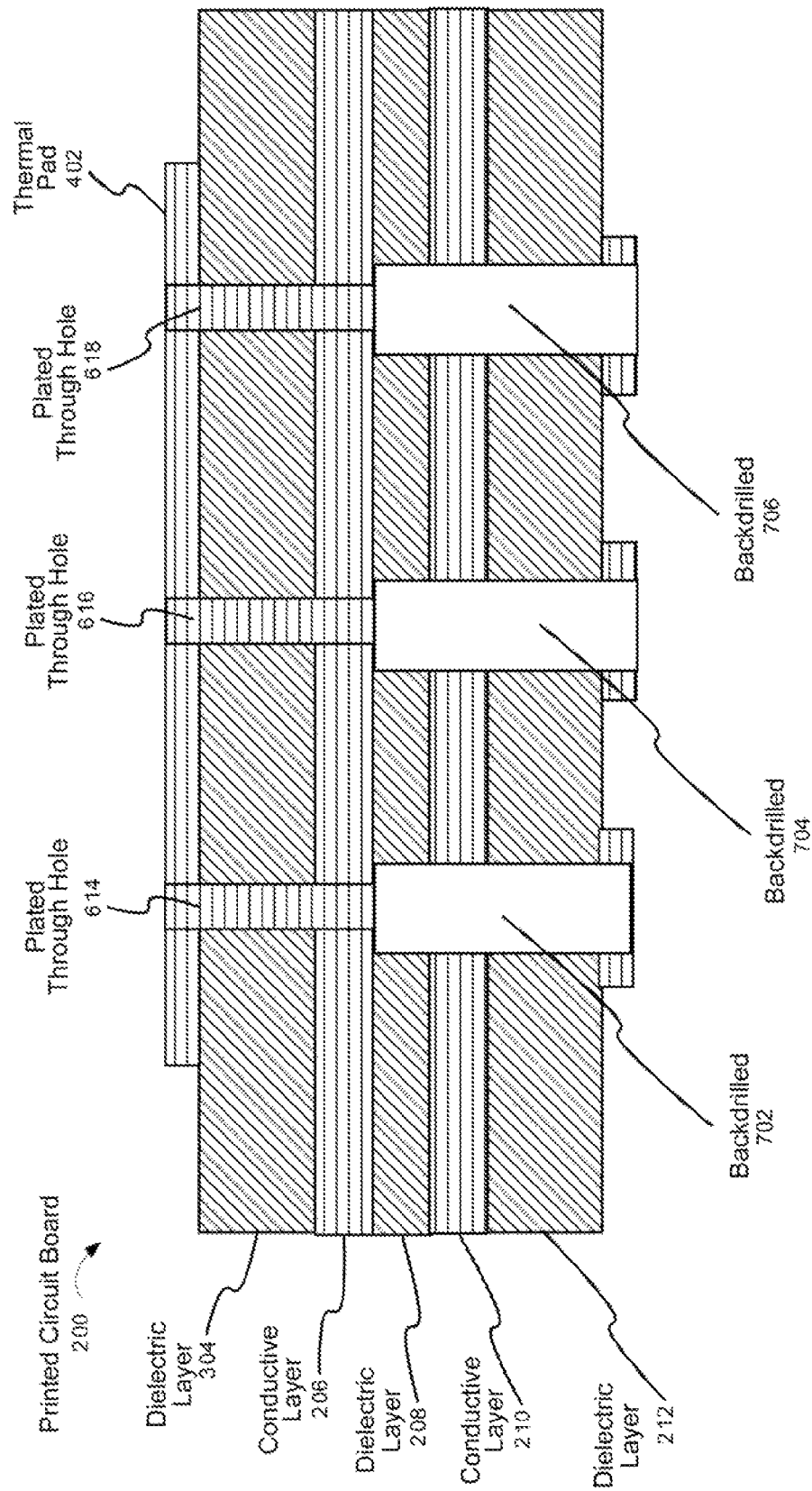
FIG. 7 depicts a cutaway side view of a PCB during a sixth stage of fabrication, according to some embodiments.

At block 112, one or more of the at least one plated through holes are backdrilled to remove a portion of the conductive material such that the conductive material remaining in the one or more plated holes electrically couples at least one conductive layer to the thermal pad. To help illustrate, FIG. 7 depicts a cutaway side view of a PCB during a sixth stage of fabrication, according to some embodiments. In particular, FIG. 7 depicts the PCB 200 at a next stage of fabrication after the stage depicted in FIG. 6. In this example, the plated through hole 614, the plated through hole 616, and the plated through hole 618 have been partially backdrilled (shown as backdrilled 702, backdrilled 704, and backdrilled 706, respectively). The backdrilling is from the bottom of the PCB 200. The backdrilling removes the conductive material from the plated through hole 614, the plated through hole 616, and the plated through hole 618 up to the point where backdrilling occurs. In this example, the backdrilling removes the conductive material from the plated through hole 614, the plated through hole 616, and the plated through hole 618 up to the top most conductive layer (the conductive layer 206).

In this example, all three plated through holes have been partially backdrilled. In some embodiments, the number of plated through holes that are backdrilled can be one, some, or all of the number of plated through holes in the PCB. Also, the amount that a plated through hole is backdrilled can be configurable. For example, a given plated through hole can be backdrilled at any percentage between 1% and 99% (e.g., 25%, 50%, 75%, etc.). In some embodiments, different plated through holes in the PCB can be backdrilled different amounts. For example, the plated through holes closer to the center of the thermal pad can be backdrilled more than the plated through holes closer to the edges of the thermal pad. In some embodiments, the amount that a plated through hole is backdrilled can be proportional to the number of plated through holes in the PCB. For example, the amount of backdrilling of the plated through holes increases as the number of plated through holes increases. In some embodiments, the number of plated through holes that are backdrilled can be based on the size of the surface area of the electronic package that is to be soldered to the thermal pad. For example, the greater the size of the surface area of the electronic package to be soldered the more number of plated through holes that are backdrilled. In some embodiments, the amount that the plated through holes are backdrilled can also be based on the size of the surface area of the electronic package that is to be soldered to the thermal pad. For example, the greater the size of the surface area of the electronic package to be soldered the greater the percentage of the plated through holes that is backdrilled. Operations of the flowchart 100 are complete.

As described, various embodiments include PCB fabrication that reduce solder voids for the solder between thermal pads of the PCB and electronic packages that are to be attached on top of the thermal pads. To help illustrate, FIGS. 8-9 depict cutaway side views of a portion of a PCB having an electronic package soldered to a thermal pad.

FIG. 8 depicts a cutaway side view of a portion of a PCB having an electronic package soldered to a thermal pad without reduced solder voids. FIG. 8 depicts a PCB 800 with the example layers depicted in FIGS. 2-7 (described above)—the thermal pad 402 on top of the dielectric layer 304 on top of the conductive layer 206 on top of the dielectric layer 208 on top of the conductive layer 210 on top of the dielectric layer 212. The PCB 800 also includes the plated through hole 618. An electronic package 806 is soldered on top of the thermal pad 402 with a solder 804. During the soldering process, large solder voids 802 are formed, in part, because of the conductive material in the plated through hole 618. Specifically, during the soldering process, the conductive material in the plated through hole 618 can thieve solder from the solder joint, thereby leaving large solder voids 802 between the electronic package 806 and the thermal pad 402. This thieving is shown by the solder in the PTH that can flow down the plated through hole 618 along its length where conductive material is located. In this example, because the conductive material is along the entire length of the plated through hole 618, the solder can flow down the entire length of the plated through hole 618.

In contrast, FIG. 9 depicts a cutaway side view of a portion of a PCB having an electronic package soldered to a thermal pad with reduced solder voids, according to some embodiments. FIG. 9 depicts a PCB 900 with the example layers depicted in FIGS. 2-7 (described above)—the thermal pad 402 on top of the dielectric layer 304 on top of the conductive layer 206 on top of the dielectric layer 208 on top of the conductive layer 210 on top of the dielectric layer 212. The PCB 900 also includes the plated through hole 618 that has been backdrilled up to the conductive layer 206. Accordingly, the conductive material in the plated through hole 618 has been removed in the dielectric layer 212, the conductive layer 210, and the dielectric layer 208. The electronic package 806 is soldered on top of the thermal pad 402 with a solder 904.

During the soldering process, small solder voids 904 are formed because of the conductive material in the plated through hole 618. Specifically, during the soldering process, the conductive material in the plated through hole 618 can thieve solder from the solder joint, thereby leaving small solder voids 904 between the electronic package 806 and the thermal pad 402. This thieving is shown by the solder in the PTH that can flow down the plated through hole 618 along its length where conductive material is located. In this example, because the conductive material is only down to the conductive layer 206 (because of the backdrilling) of the plated through hole 618, the solder can only flow down the plated through hole 618 down to the conductive layer 206. As shown, the solder voids in the solder between the electronic package 806 and the thermal pad 402 are less when the plated through holes are backdrilled.

Accordingly, various embodiments can still allow for thermal dissipation from the electronic package down through the plated through holes to one or more conductive layers in the PCB, while limiting the size of the solder voids in the solder between the electronic package and the thermal pad.

While the embodiments are described with reference to various implementations and exploitations, it will be understood that these embodiments are illustrative and that the scope of the inventive subject matter is not limited to them. In general, techniques for PCB fabrication to provide reduced solder void reduction for the solder between an electronic package and a thermal pad of the PCB as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. An apparatus comprising:
 a printed circuit board comprising,
  a first dielectric layer;
  at least one conductive layer formed on top of the first dielectric layer, wherein the at least one conductive layer comprises at least one of a ground plane and a power plane;
  a second dielectric layer formed on top of the at least one conductive layer;
  a thermal pad formed on top of the second dielectric layer, wherein an electrical package is to be soldered on top of the thermal pad;
  at least one plated through hole partially filled with conductive material, wherein the at least one plated through hole extends through the thermal pad, the second dielectric layer, the at least one conductive layer, and the first dielectric layer, wherein the conductive material electrically couples one or more of the at least one conductive layer to the thermal pad; and
  a backdrilled hole extending from the bottom of the printed circuit board to the at least one plated through hole, the backdrilled hole remaining after removal of a portion of the conductive material from the at least one plated through hole.

2. The apparatus of claim 1, wherein the at least one conductive layer comprises a ground plane.

3. The apparatus of claim 1, wherein the at least one conductive layer comprises at least three conductive layers, wherein the conductive material remaining in the at least one plated through hole electrically couples a first conductive layer of the at least three conductive layers but does not electrically couple other conductive layers of the at least three conductive layers.

4. The apparatus of claim 3, wherein the first conductive layer comprises a topmost conductive layer of the at least three conductive layers.

5. The apparatus of claim 1, wherein use of the at least one conductive layer is independent of signaling during operation of the electronic package.

6. The apparatus of claim 1, wherein the thermal pad comprises a copper pad.

7. The apparatus of claim 1, further comprising the electronic package soldered on top of the thermal pad.

8. The apparatus of claim 1, wherein the electronic package comprises a Quad Flat No-lead package.

* * * * *